(12) United States Patent
Sackett

(10) Patent No.: US 10,817,493 B2
(45) Date of Patent: Oct. 27, 2020

(54) DATA INTERPOLATION

(71) Applicant: Raytheon Company, Waltham, MA (US)

(72) Inventor: James R. Sackett, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 261 days.

(21) Appl. No.: 15/644,021

(22) Filed: Jul. 7, 2017

(65) Prior Publication Data

US 2019/0012337 A1  Jan. 10, 2019

(51) Int. Cl.

| G06F 16/00 | (2019.01) |
|---|---|
| G06F 12/00 | (2006.01) |
| H03K 19/10 | (2006.01) |
| G06F 16/22 | (2019.01) |
| H03K 19/17704 | (2020.01) |
| H03K 19/17728 | (2020.01) |
| G06F 12/02 | (2006.01) |
| H03K 19/1776 | (2020.01) |
| H01L 27/28 | (2006.01) |

(52) U.S. Cl.
CPC ...... *G06F 16/2282* (2019.01); *G06F 12/0207* (2013.01); *G06F 16/221* (2019.01); *H01L 27/281* (2013.01); *H03K 19/1776* (2013.01); *H03K 19/17704* (2013.01); *H03K 19/17728* (2013.01)

(58) Field of Classification Search
CPC .... G06F 16/2282; G06F 12/0864; G06F 9/38; G06F 11/106; G06F 16/221; G06F 12/0207; H03K 19/17704; H03K 19/17728; H03K 19/1776; H01L 27/281
See application file for complete search history.

(56) References Cited

U.S. PATENT DOCUMENTS

| 4,402,012 | A | 8/1983 | Knight | |
|---|---|---|---|---|
| 4,578,812 | A | 3/1986 | Yui | |
| 4,667,308 | A | 5/1987 | Hayes et al. | |
| 5,325,500 | A * | 6/1994 | Bell | G06F 9/38 711/157 |
| 5,434,992 | A * | 7/1995 | Mattson | G06F 12/0848 711/119 |
| 5,684,981 | A | 11/1997 | Jones | |
| 5,966,143 | A | 10/1999 | Breternitz, Jr. | |
| 6,144,604 | A | 11/2000 | Haller et al. | |
| 6,275,894 | B1 * | 8/2001 | Kuo | G11C 8/12 365/185.11 |

(Continued)

FOREIGN PATENT DOCUMENTS

| EP | 0827082 B1 | 8/2006 |
|---|---|---|
| WO | WO-2014172227 A1 | 10/2014 |

*Primary Examiner* — Srirama Channavajjala

(74) *Attorney, Agent, or Firm* — Schwegman Lundberg & Woessner, P.A.

(57) ABSTRACT

Generally discussed herein are systems, devices, and methods for data interpolation. A system for data interpolation can include first circuitry to split a set of data into four disjoint subsets including first, second, third, and fourth subsets and load each of the disjoints subsets into respective first, second, third, and fourth memory portions, second circuitry to retrieve, simultaneously, data from each of the first, second, third, and fourth memory portions, and interpolation circuitry to perform, based on the retrieved data, data interpolation.

17 Claims, 13 Drawing Sheets

(56) References Cited

U.S. PATENT DOCUMENTS

| | | | | |
|---|---|---|---|---|
| 6,781,857 B1* | 8/2004 | Lien | G11C 15/00 | 365/189.07 |
| 6,819,623 B2* | 11/2004 | Jung | G11C 11/4087 | 365/230.03 |
| 7,057,962 B1* | 6/2006 | Tan | G11C 7/1075 | 365/189.04 |
| 7,134,069 B1* | 11/2006 | Longwell | G06F 11/106 | 714/800 |
| 7,461,208 B1* | 12/2008 | Caprioli | G06F 12/0864 | 711/128 |
| 7,577,819 B2 | 8/2009 | Buchty et al. | | |
| 8,120,989 B2 | 2/2012 | Chen et al. | | |
| 9,329,834 B2 | 5/2016 | Jakovljevic et al. | | |
| 2004/0076040 A1* | 4/2004 | Pfeiffer | G11C 11/4076 | 365/199 |
| 2004/0268227 A1* | 12/2004 | Brid | G06F 40/183 | 715/220 |
| 2007/0052713 A1* | 3/2007 | Chung | G06T 15/04 | 345/501 |
| 2007/0279966 A1* | 12/2007 | Houston | G11C 11/412 | 365/154 |
| 2008/0049719 A1* | 2/2008 | Andreev | H03M 13/2764 | 370/351 |
| 2008/0072185 A1* | 3/2008 | Baumgartner | G06F 17/505 | 716/103 |
| 2008/0091386 A1* | 4/2008 | Baumgartner | G06F 17/505 | 703/1 |
| 2008/0151621 A1* | 6/2008 | Kong | G11C 16/0483 | 365/185.03 |
| 2011/0057942 A1* | 3/2011 | Mantor | G06T 1/60 | 345/561 |
| 2011/0211383 A1* | 9/2011 | Russell | G11C 7/14 | 365/148 |
| 2012/0106287 A1* | 5/2012 | Catovic | G06F 12/0607 | 365/230.03 |
| 2014/0310496 A1 | 10/2014 | Eguro et al. | | |
| 2014/0359249 A1* | 12/2014 | Kho | G11C 16/24 | 711/173 |
| 2015/0324325 A1* | 11/2015 | Chen | G06F 17/18 | 702/181 |
| 2016/0042019 A1* | 2/2016 | Oks | G06F 16/215 | 707/602 |
| 2016/0275013 A1* | 9/2016 | Van Lunteren | G06F 12/0607 | |
| 2017/0025477 A1* | 1/2017 | Boniardi | H01L 45/1233 | |

* cited by examiner

DATA INTERPOLATION

TECHNICAL FIELD

Embodiments discussed herein relate to devices, systems, and methods for data interpolation.

BACKGROUND

Interpolation of data provides a determination of an approximate value for a point not precisely represented in a data set, such as a two-dimensional data set. Interpolation can account for an effect of two dimensions of slope in the data set. Interpolation typically involves performing mathematical operations on a subset of points in the data set. Interpolation generally accounts for distances between a point of interest and closest points in the data set. Typically, the points in the data are in a uniformly distributed grid, so typical interpolation includes four points of data from the data set.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments or examples discussed in the present document.

DETAILED DESCRIPTION

Embodiments in this disclosure generally relate to data interpolation, such as using a plurality of memories.

When raster scanning data, as in an image, an interpolation method or system can usually take advantage of cached data, such that for each point to be interpolated, three of the four values to be used to interpolate the point may already be known. When randomly accessing data, all four points may need to be fetched from a single memory resulting in about twenty-five percent performance. In some solutions to interpolation, a copy of the entire data may be made available in each of four memories. Such solutions increase an amount of storage required to hold the data set used for interpolation by four times.

Discussed herein are embodiments of interpolation devices, methods, and systems that increase a speed at which interpolation can be calculated. The embodiments can include just a single copy of a data used to calculate an interpolated point. The data set is split into four memories that each includes about one quarter of the source data, such that only one full data set is stored. This allows all four points to be used in an interpolation calculation to be retrieved in a single memory access interval. Embodiments can include various ways of generating addresses for the data in the four memories. Embodiments can include various ways of populating the four memories. Embodiments can include various ways of reading the data from the four memories.

Figure 1:
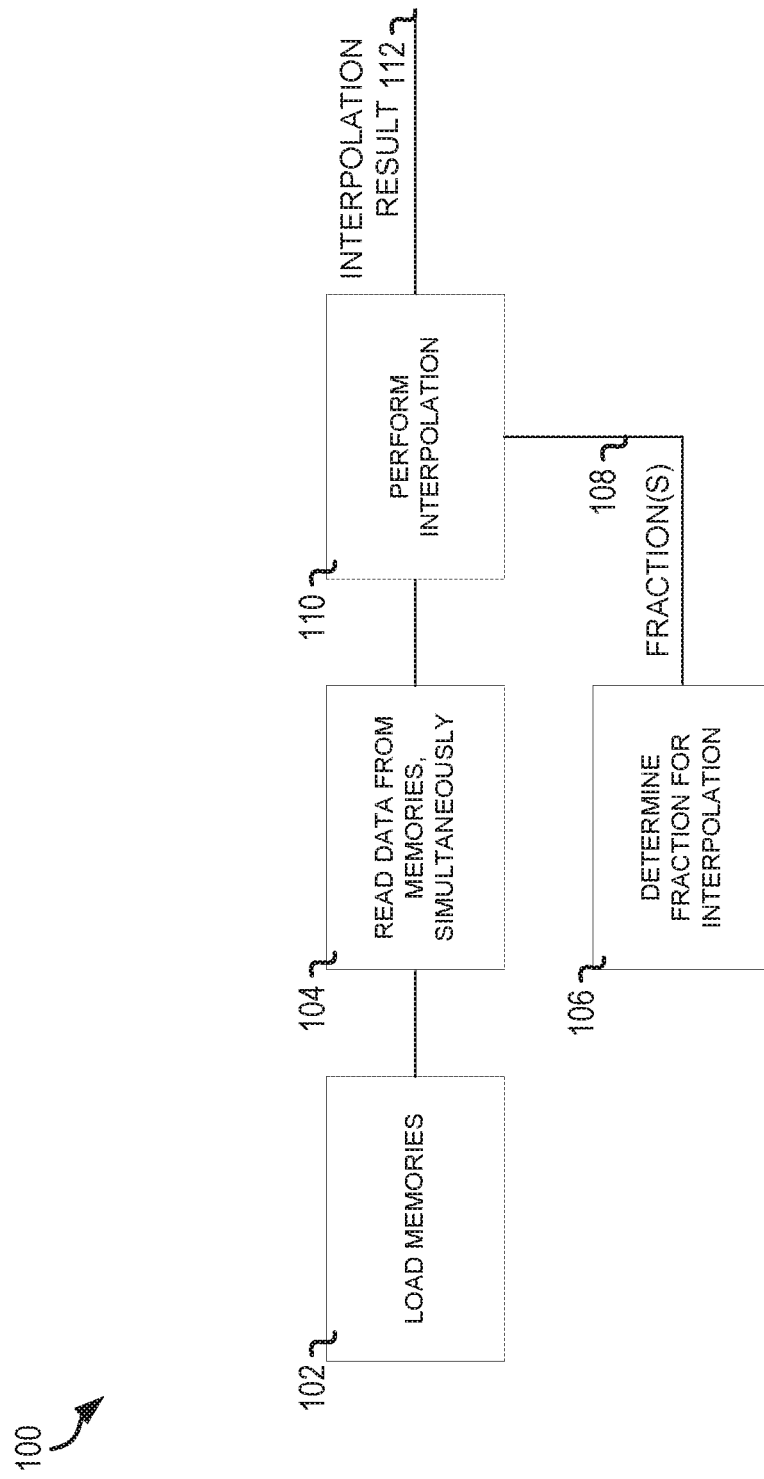
FIG. 1 illustrates, by way of example, a diagram of an embodiment of a method for performing an interpolation.

FIG. 1 illustrates, by way of example, a diagram of an embodiment of a method 100 for performing an interpolation. The method 100 as illustrated includes loading memories, at operation 102; reading data from each of the memories (simultaneously), at operation 104; determining a fraction for interpolation, at operation 106; and performing interpolation, at operation 110.

Figure 2:
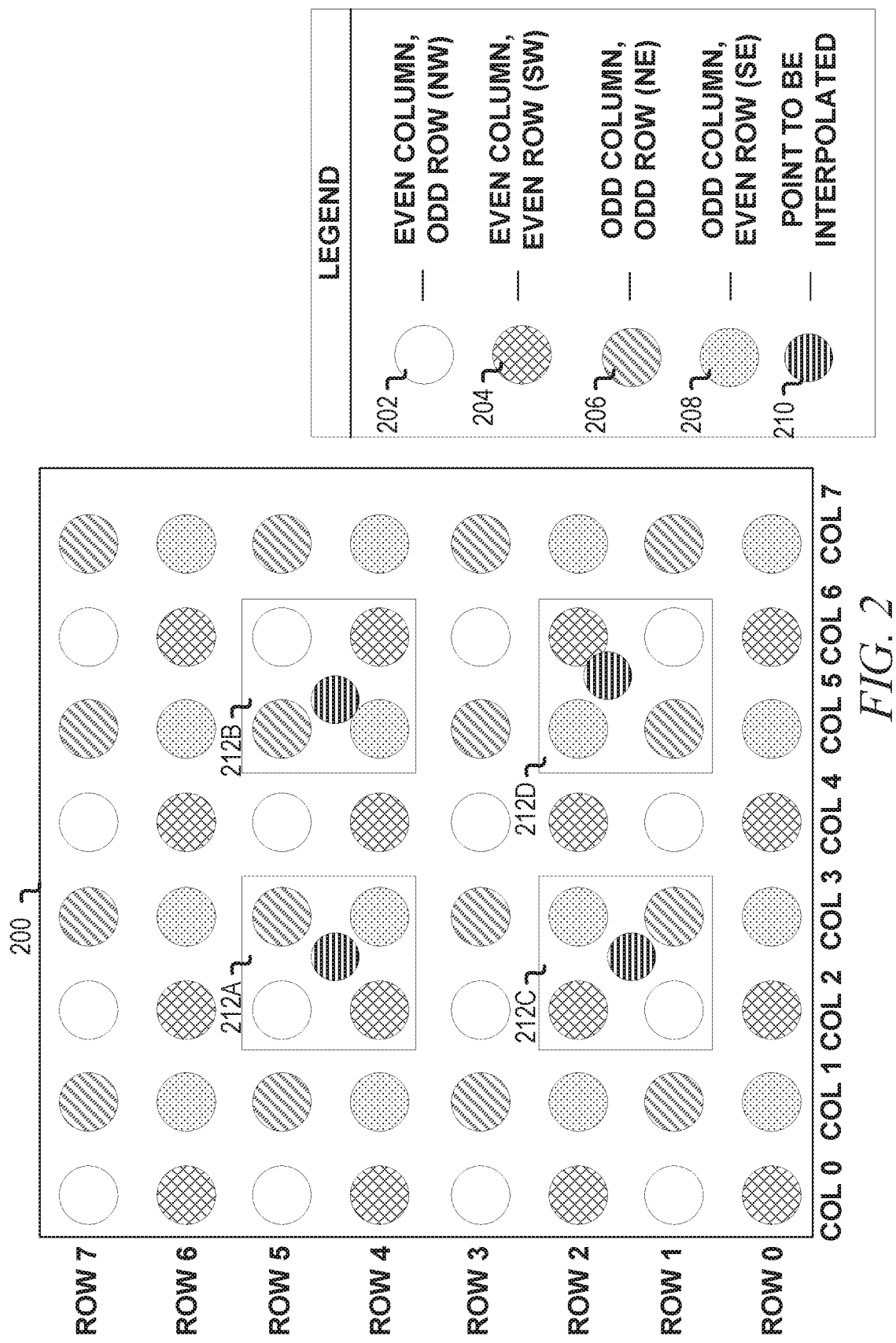
FIG. 2 illustrates, by way of example, an embodiment of an interpolation data set that includes the data set split into respective disjoint subsets.
Figure 3:
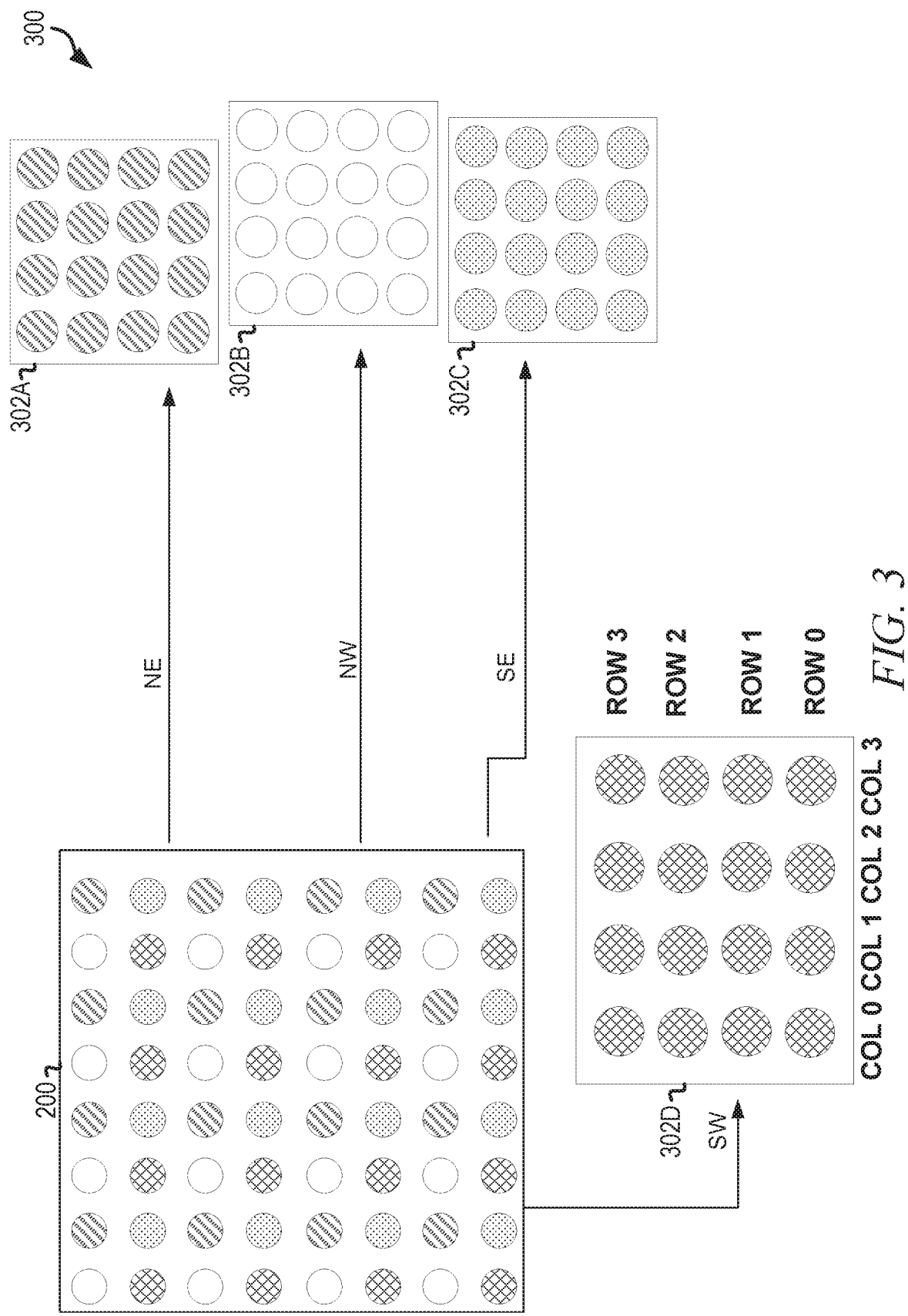
FIG. 3 illustrates, by way of example, a diagram of an embodiment of the data set getting loaded into separately accessible memory portions.
Figure 4:
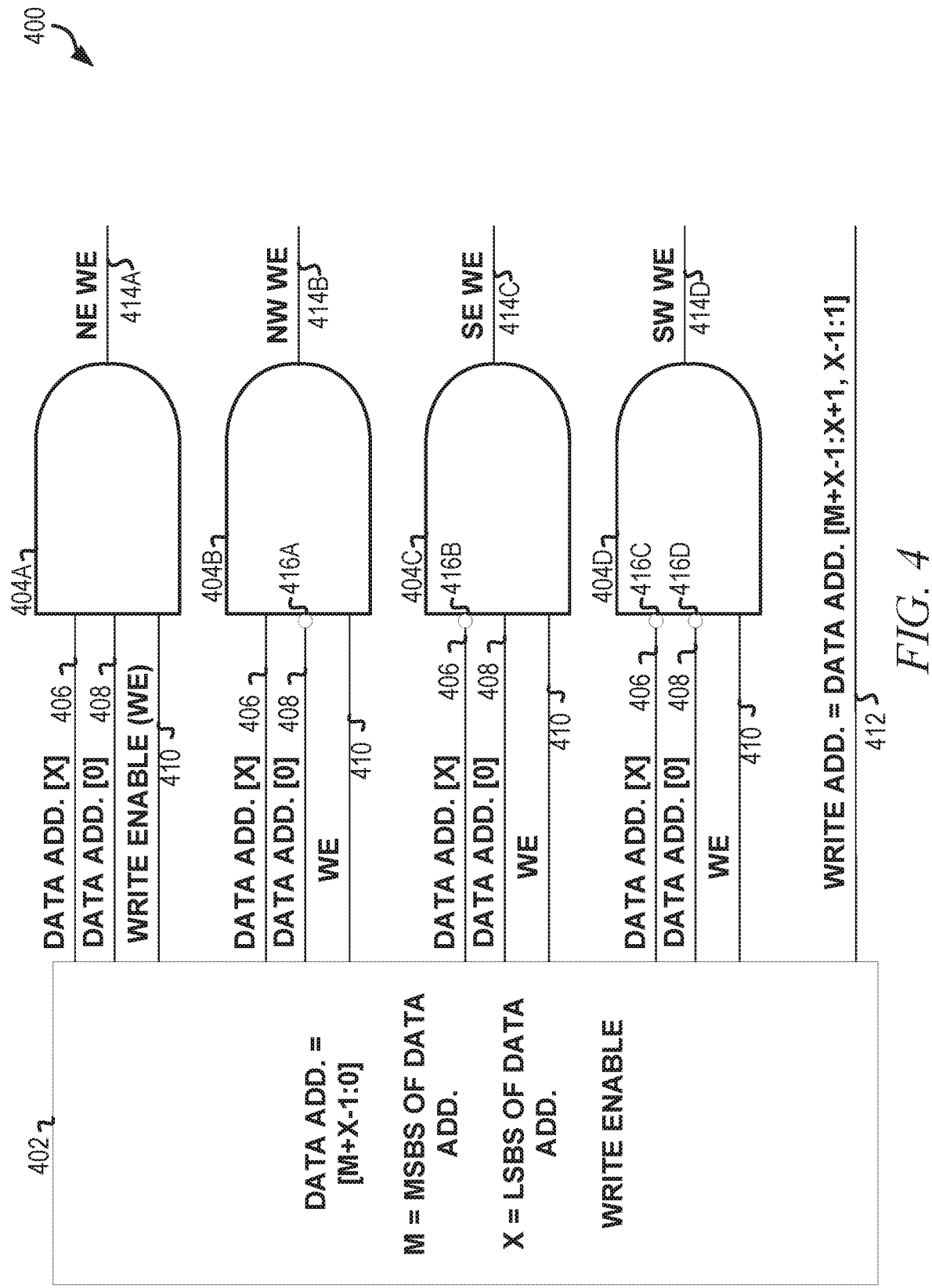
FIG. 4 illustrates, by way of example, a diagram of an embodiment of a system for loading data into the memory portions.

The operation 102 can include splitting a data set that is used to interpolate the data into a plurality of disjoint subsets of data. In some embodiments, the disjoint subsets can include: (1) all data points at an odd row and odd column, (2) all data points at an odd row and even column, (3) all data points at an even row and even column, and (4) all data points at an even row and an odd column. Each of the data sets can be loaded into a respective memory or a respective partition of a memory that is accessible at a same time as another partition of the memory. FIGS. 2, 3, and 4 provide further details regarding splitting the data and loading the data into memories. The operation 104 can include details discussed regarding FIGS. 6-9.

The operation 106 can include receiving input from a user, such as through a user interface. The operation 106 can include performing mathematical operations to determine for a point to be interpolated, relatively, how much closer to a specific point of the data set is compared to a directly adjacent point in the data set. The result of operation 106 can include fraction(s) 108. The fraction(s) 108 indicate a relative distance between a point and a directly adjacent point. The fraction(s) 108 can include a row fraction that indicates the relative distance between directly adjacent row points. The fraction(s) 108 can include a column fraction that indicate a relative distance between directly adjacent column points.

The operation 110 can include using the fraction(s) 108 and the data read from operation 104 to determine an interpolation result 112. There are many methods of performing interpolation. Embodiments discussed herein can help reduce an overall amount of time it takes to perform an interpolation operation by reducing an amount of time it takes to retrieve data to be used in the data interpolation.

FIG. 2 illustrates, by way of example, an embodiment of an interpolation data set 200 that includes the data set 200 split into respective disjoint subsets 202, 204, 206, and 208. While the data set 200 is illustrated as including a same number of columns as rows, the number of columns and rows can be different. As illustrated, the data points at even columns and odd rows are part of the data subset 202. As illustrated, the data points at even columns and even rows are part of the data subset 204. As illustrated, the data points at odd columns and odd rows are part of the data subset 206. As illustrated, the data points at odd columns and even rows are part of the data subset 208. Example data points to be interpolated 210 are illustrated as well.

Note that a data point to be interpolated falls somewhere within a box defined by vertices corresponding to four data points in the data set. The vertices that define the box include a data point from each of the subsets 202, 204, 206, and 208. The subset of data that corresponds to an upper left vertex of the box can change. Some circuitry is presented to help account for this change elsewhere herein.

A box 212A includes a point from the subset 202 that defines the upper left vertex. A box 212B includes a point from the subset 206 that defines the upper left vertex. A box 212C includes a point from the subset 204 that defines the upper left vertex. A box 212D includes a point from the subset 208 that defines the upper left vertex.

FIG. 3 illustrates, by way of example, a diagram of an embodiment of the data set 200 getting loaded into separately accessible memory portions 302A, 302B, 302C, and 302D. The memory portion 302A is loaded with data from odd columns and odd rows (e.g., data subset 206). The memory portion 302B is loaded with data from even columns and odd rows (e.g., data subset 202). The memory portion 302C is loaded with data from odd columns and even rows (e.g., data subset 208). The memory portion 302D is loaded with data from even columns and even rows (e.g., data subset 204). The memory portions 302A-302D can each be individual memories or an individually accessible partition of a memory.

FIG. 4 illustrates, by way of example, a diagram of an embodiment of a system 400 for loading data into the memory portions 302A-302D. The system 400 as illustrated includes four, three input AND gates 404A, 404B, 404C, and 404D. The system 400 includes some inverters 416A, 416B, 416C, and 416D on some of the inputs to the AND gates 404B-404D.

The inputs to the AND gates 404A-404D are derived from the address and write enable data 402. The address data can be composed of a combination of a column number and a row number of the data in the data set 200. For example, a data point at row R and column C of the data set 200 can include an address that includes the row as the most significant bits (MSBs) and the column as the least significant bits (LSBs), or vice versa. In this example, the address can be [RC] or [CR]. If R is five and C is four, the address can be [101100] or [100101]. In another example, if R is zero and C is two, the address can be [000010] or [010000]. The data address ("DATA ADD.") of the data 402 is this combination of column number and row number with M MSBs and X LSBs, where M and X are integers. So, the data address is represented by data with a structure [M+X−1:0] with bit X being the LSB of the row number and bit zero being the LSB of the column number. The LSB of the row number and the column number represent whether the row and column are odd or even, respectively. An LSB of zero corresponds to a row/column that is even. An LSB of one corresponds to a row/column that is odd.

The inputs to the AND gates 404A-404D include the LSB of the row number (e.g., data add. [X] 406). The inputs to the AND gates 404A-404D include the LSB of the column number (e.g., data add. [0] 408). The inputs to the AND gates 404A-404D include a write enable 410. The AND gate 404A includes no inverters on its inputs, so the output 414A is one for odd rows and odd columns (e.g., an NE address) and a write enable 410 of one, and zero otherwise. The AND gate 404B includes an inverter 416A on the data add. [0] 408 input, with no other inverters, so an output 414B is one for odd rows and even columns (e.g., an NW address) and a write enable 410 of one, and zero otherwise. The AND gate 404C includes an inverter 416B on the data add. [X] 406 input, so output 414C is one for even rows and odd columns (e.g., a SE address) and a write enable 410 of one, and zero otherwise. The AND gate 404D includes inverters 416C and 416D on both data add. [X] 406 and data add. [0] 408 inputs, so an output 414D is one for even columns and even rows (e.g., an SW address) and a write enable 410 of one, and zero otherwise. Note that for any address, at most one of the outputs 414A-414D is one. The outputs 414A-414D can serve as write enables for loading the data into respective memory portions 302A-302D, respectively.

The address of the respective memory portion 302A-302D to which the data is written can include the row number without the LSB of the row number and the column number without the LSB of the column number. This is represented by the write address 412. Note that this is just one example of how the data can be addressed into the memory portions 302A-302D and that other addressing schemes can be used to achieve similar results.

Note that while AND gates are used in FIG. 4, a variety of other implementations for determining which memory portion to load data in are possible. For example, the AND gates could be replaced with OR gates, NOR gates, NAND gates, or the like, and inverters properly placed on the inputs to achieve equivalent logic (e.g., by DeMorgans theorem). Alternatively, a lookup table can relate an address from the full data set to an address in a memory portion 302A-302D.

Figure 5:
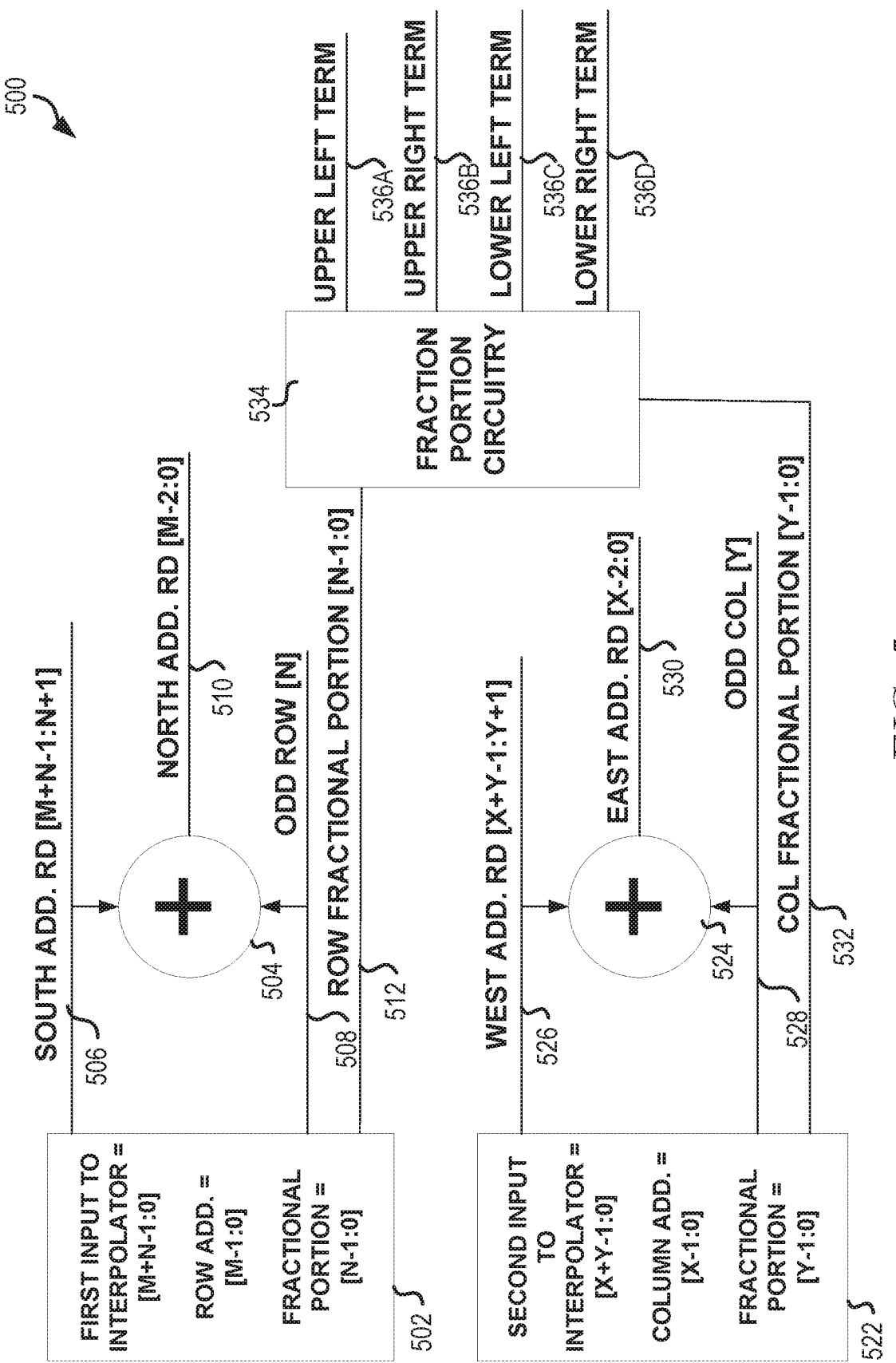
FIG. 5 illustrates, by way of example, a diagram of an embodiment of a system for determining addresses to read from the memory portions and fraction portion circuitry used to generate interpolation terms.

FIGS. 5-8 describe circuitry and other logic for retrieving data from the memory portions 302A-302D and performing interpolation based on the retrieved data. FIG. 5 illustrates, by way of example, a diagram of an embodiment of a system 500 for determining addresses to read from the memory portions 302A-302D. The system 500 further includes circuitry 534 to interpret the row fractional portion 512 and column fractional portion 532 into terms to be applied to read data during interpolation. The system 500 as illustrated includes input data 502 from which a row fractional portion 512 and inputs to an adder 504 are derived. The input data 502 includes the M row bits and N bits that represent the row fractional portion 512. The M row bits indicate a row from which data will be used for interpolation, and in some embodiments are part of a read address. The system 500 as illustrated includes input data 522 from which a column fractional portion 532 and inputs to an adder 524 are derived. The input data 522 as illustrated includes the X column bits and Y bits that represent the column fractional portion 532. The X column bits indicate a column from which data will be used for interpolation, and in some embodiments are part of a read address.

The input data 502 includes a row address (M bits) and a fractional portion (N bits). If the row address and the fractional portion are combined, with the row address being the MSBs and the fractional portion being the LSBs, there is an input of M+N bits. A south address read 506 output can be derived directly from the input data 502. The south address read 506 is M−1 bits long and include the row address minus the LSB of the row address. An adder 504 can be used to determine a north address read 510. Inputs to the adder 504 can include all the bits of the south address read 506 and an LSB of the row address (e.g., bit N of the input data 502, labelled odd row [N] 508). An output of the adder 504 can include a north address read 510. The row fractional portion 512 can indicate a relative distance between the rows at which a point to be interpolated resides. The row fractional portion 512 can be input, such as by a user through a user interface, produced by a processor, or the like.

The inputs 522 include a column address (X bits) and a column fractional portion 532 (Y bits). If the column address and the fractional portion are combined, with the column address being the MSBs and the fractional portion being the LSBs, there is an input of X+Y bits. A west address read 526 output can be derived directly from the input 522. The west address read 526 is M−1 bits long and includes the column address minus the LSB of the column address. An adder 524 can be used to determine an east address read 530. Inputs to the adder 524 can include all the bits of the west address read 526 and an LSB of the column address (e.g., bit Y of the input 522, labelled odd col [Y] 528). An output of the adder 524 can include the east address read 530. The column fractional portion 532 can indicate a relative distance between the columns at which the point to be interpolated resides. The column fractional portion 532 can be input, such as by a user through a user interface, produced by a processor, or the like.

The fraction portion circuitry 534 receives the row fractional portion 512 and the column fractional portion 532 as inputs and produces fractional portion terms to be applied to respective data in performing interpolation. The fraction portion circuitry 534 can include one or more electric or electronic components, such as discussed with regard to the interpolator circuitry 802 and/or 812 (see FIGS. 8A and 8B). The fraction portion circuitry 534 converts the row fractional portion 512 and the column fractional portion 532 to weights (e.g., integers, real numbers, or the like), namely an upper left term 536A, an upper right term 536B, a lower left term 536C, and lower right term 536D. Each of the terms 536A-536D indicate how much a corresponding data read from a corresponding memory portion 302A-302D (not necessarily respectively) influences a final interpolator result. The method of determining the weights can include a variety of different operations and techniques and this disclosure does not define or restrict which methods may be used to generate the weights.

Figure 6:
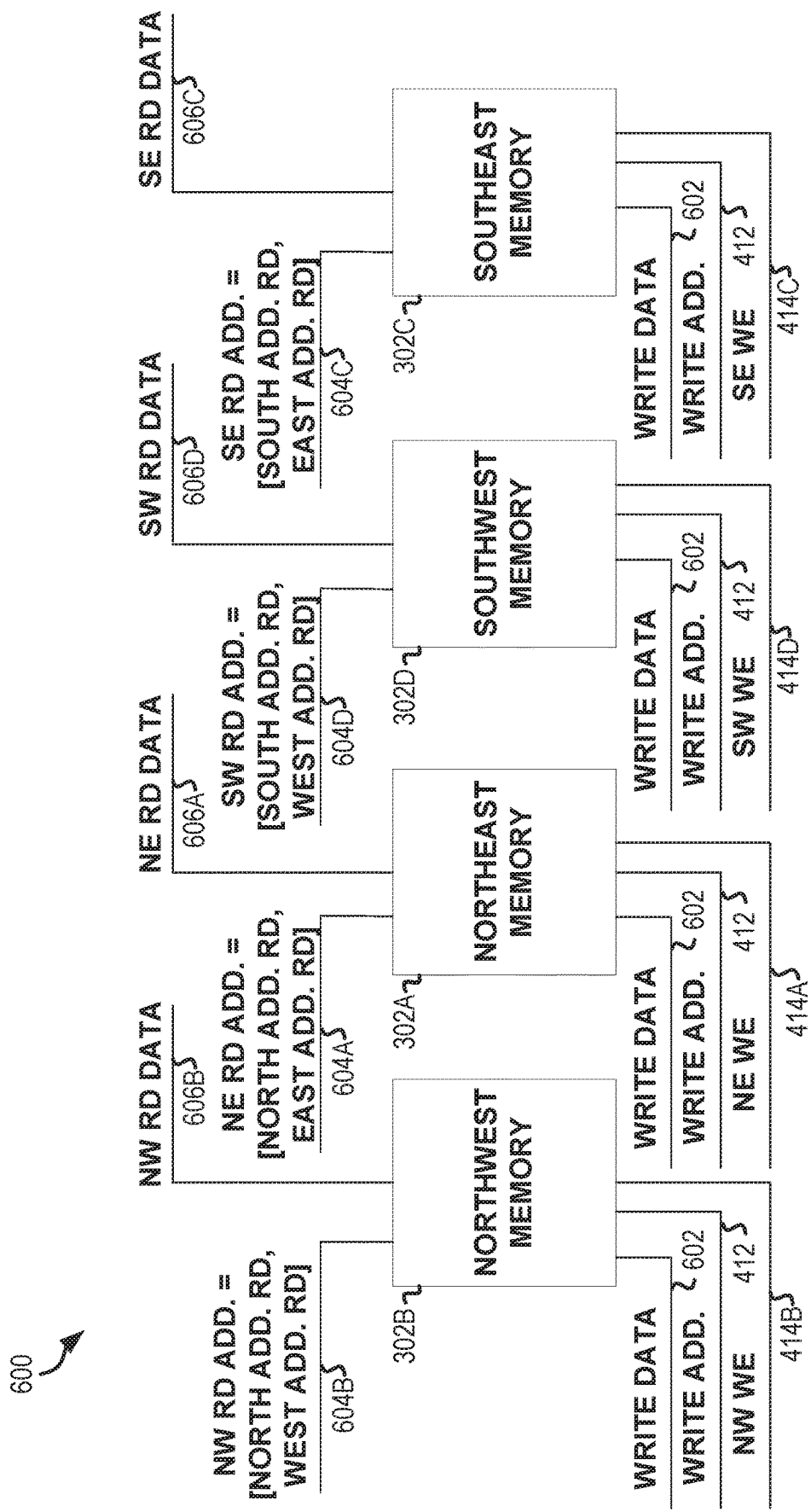
FIG. 6 illustrates, by way of example, a diagram of an embodiment of a system of memory portions.

FIG. 6 illustrates, by way of example, a diagram of an embodiment of a system 600 of memory portions 302A-302D. The memory portions 302A-302D include write data inputs including respective write enables 414A-414D and/or a write address 412, such as illustrated in FIG. 4, and write data 602. The write data inputs can be used to populate the respective memory portions 302A-302D. The memory portions 302A-302D include respective read address inputs 604A, 604B, 604C, and 604D and read data 606A, 606B, 606C, and 606D.

The read address input 604A includes a combination of the north address read 510 and the east address read 530. The north address read 510 can occupy the MSBs of the read address input 604A and the east address read 530 can occupy the LSBs of the read address input 604A. The read address input 604B includes a combination of the north address read 510 and the west address read 526. The north address read 510 can occupy the MSBs of the read address input 604B and the west address read 526 can occupy the LSBs of the read address input 604B. The read address input 604C includes a combination of the south address read 506 and the east address read 530. The south address read 506 can occupy the MSBs of the read address input 604C and the east address read 530 can occupy the LSBs of the read address input 604C. The read address input 604D includes a combination of the south address read 506 and the west address read 526. The south address read 506 can occupy the MSBs of the read address input 604D and the west address read 526 can occupy the LSBs of the read address input 604D. The read data 606A-606D includes the data that occupies a location in a respective memory portion 302A-302D at the respective read address input 604A-604D.

Figure 7A:
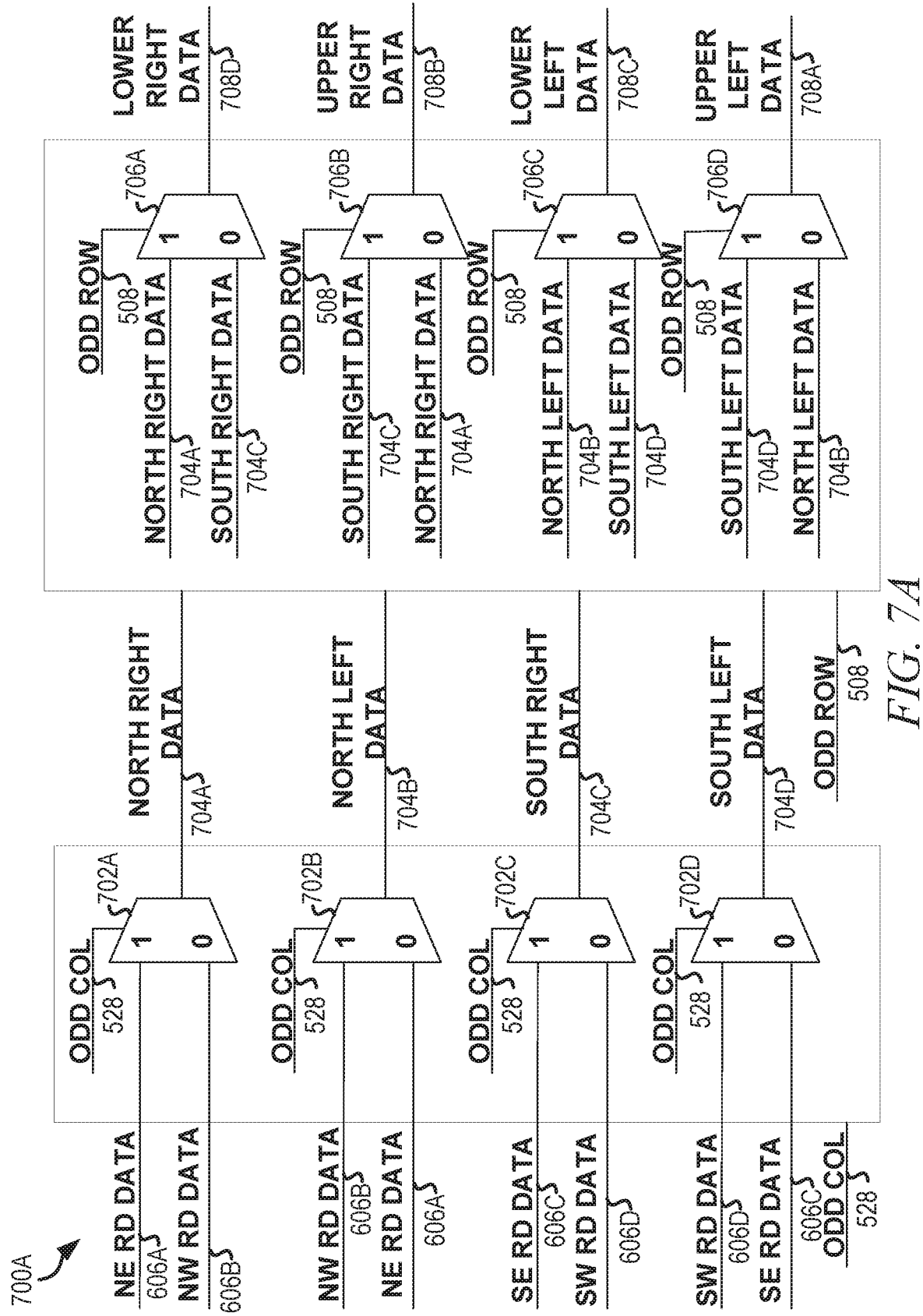
FIG. 7A illustrates, by way of example, a diagram of an embodiment of circuitry to alter positions of read data.

FIG. 7A illustrates, by way of example, a diagram of an embodiment of circuitry 700A to alter positions of read data. The circuitry 700A can orient the read data 606A-606D so that the terms 536A-536D are applied to the read data 606A-606D properly. Consider the boxes 212A and 212B. The data from the subset 206 occupies a different vertex of the box 212A and 212B (e.g., data from the subset 206 occupies the upper left vertex of the box 212B and data from the subset 206 occupies the upper right vertex of the box 212A). This means that the NW subset does not necessarily include the data that occupies the upper left or upper right corner of the box 212A-212D and that the term may need to be swapped for the read data from the NE subset, such as to make the row fractional portion 512 apply properly to the data to be used in the interpolation. Similarly, consider the boxes 212B and 212C. The data from the subset 204 occupies a different vertex of the box 212B and 212C (e.g., data from the subset 204 occupies the lower right vertex of the box 212B and data from the subset 204 occupies the upper left vertex of the box 212C). This means that the SW subset does not necessarily include the data that occupies the lower left or lower right corner of the box 212A-212D and that the term may need to be swapped for the read data from another subset, such as to make the column fractional portion 532 apply properly to the data to be used in the interpolation. The circuitry 700A can handle the swapping of the data so that the terms 536A-536D are applied properly to the proper data.

The circuitry 700A as illustrated includes a first level of multiplexers 702A, 702B, 702C, and 702D and a second level of multiplexers 706A, 706B, 706C, and 706D. The multiplexers 702A-702D swaps read data in a column direction (e.g., left/right as shown in FIG. 2). The multiplexers 706A-706D swap read data in a row direction (e.g., up/down as shown in FIG. 2).

The inputs to the multiplexers 702A-702D include read data from each of the memory portions 302A-302D. As illustrated, the inputs include the NE read data 606A, NW read data 606B, SE read data 606C, and SW read data 606D from FIG. 6. The inputs to the multiplexers 702A-702D further include the odd column 528 from FIG. 5.

The multiplexer 702A outputs north right data 704A (upper right in terms of which vertex of the box 212A-212D the data represents). If odd column 528 is one, the north right data 704A is the NE read data 606A. If odd column 528 is zero, the north right data 704A is the NW read data 606B. The multiplexer 702B outputs north left data 704B (upper left in terms of which vertex of the box 212A-212D the data represents). If odd column 528 is one, the north left data 704B is the NW read data 606B. If odd column 528 is zero, the north left data 704B is the NE read data 606A.

The multiplexer 702C outputs south right data 704C (lower right in terms of which vertex of the box 212A-212D the data represents). If odd column 528 is one, the south right data 704C is the SE read data 606C. If odd column 528 is zero, the south right data 704C is the SW read data 606D.

The multiplexer 702D outputs south left data 704D (lower left in terms of which vertex of the box 212A-212D the data represents). If odd column 528 is one, the south left data 704D is the SW read data 606D. If odd column 528 is zero, the south left data 704D is the SE read data 606C.

The inputs to the multiplexers 706A-706D include the outputs from the multiplexers 702A-702D (e.g., the north right data 704A, the north left data 704B, the south right data 704C, and the south left data 704D). The inputs to the multiplexers 706A-706D further include the odd row 508 from FIG. 5.

The multiplexer 706A outputs lower right data 708D (lower right in terms of which vertex of the box 212A-212D the data represents). If odd row 508 is one, the lower right data 708D is the north right data 704A. If odd row 508 is zero, the lower right data 708D is the south right data 704C. The multiplexer 706B outputs upper right data 708B (upper right in terms of which vertex of the box 212A-212D the data represents). If odd row 508 is one, the upper right data 708B is the south right data 704C. If odd row 508 is zero, the upper right data 708B is the north right data 704A.

The multiplexer 706C outputs lower left data 708C (lower left in terms of which vertex of the box 212A-212D the data represents). If odd row 508 is one, the lower left data 708C is the north left data 704B. If odd row 508 is zero, the lower left data 708C is the south left data 704D. The multiplexer 706D outputs upper left data 708A (upper left in terms of which vertex of the box 212A-212D the data represents). If odd row 508 is one, the upper left data 708A is the south left data 704D. If odd row 508 is zero, the upper left data 708A is the north left data 704B.

Note that the order of flipping row-wise and column-wise is a design choice that can be changed. The data can be swapped column-wise and then row-wise (if necessary). Also note that the embodiment shown in FIG. 7A alters the orientation of the read data 606A-606D (if necessary) to match the column and row fractional portion terms 536A-536D. Alternatively, the column and row fractional portion terms 536A-536D for each read data 606A-606D can be swapped to match the orientation of the data. Such an embodiment is similar to the embodiment shown with respective fractional portion terms replacing the read data in FIG. 7A. The output in such an embodiment is the fractional portion terms as they apply to the data from the respective memory portions 302A-302D. Such a system is illustrated in FIG. 7B.

Figure 7B:
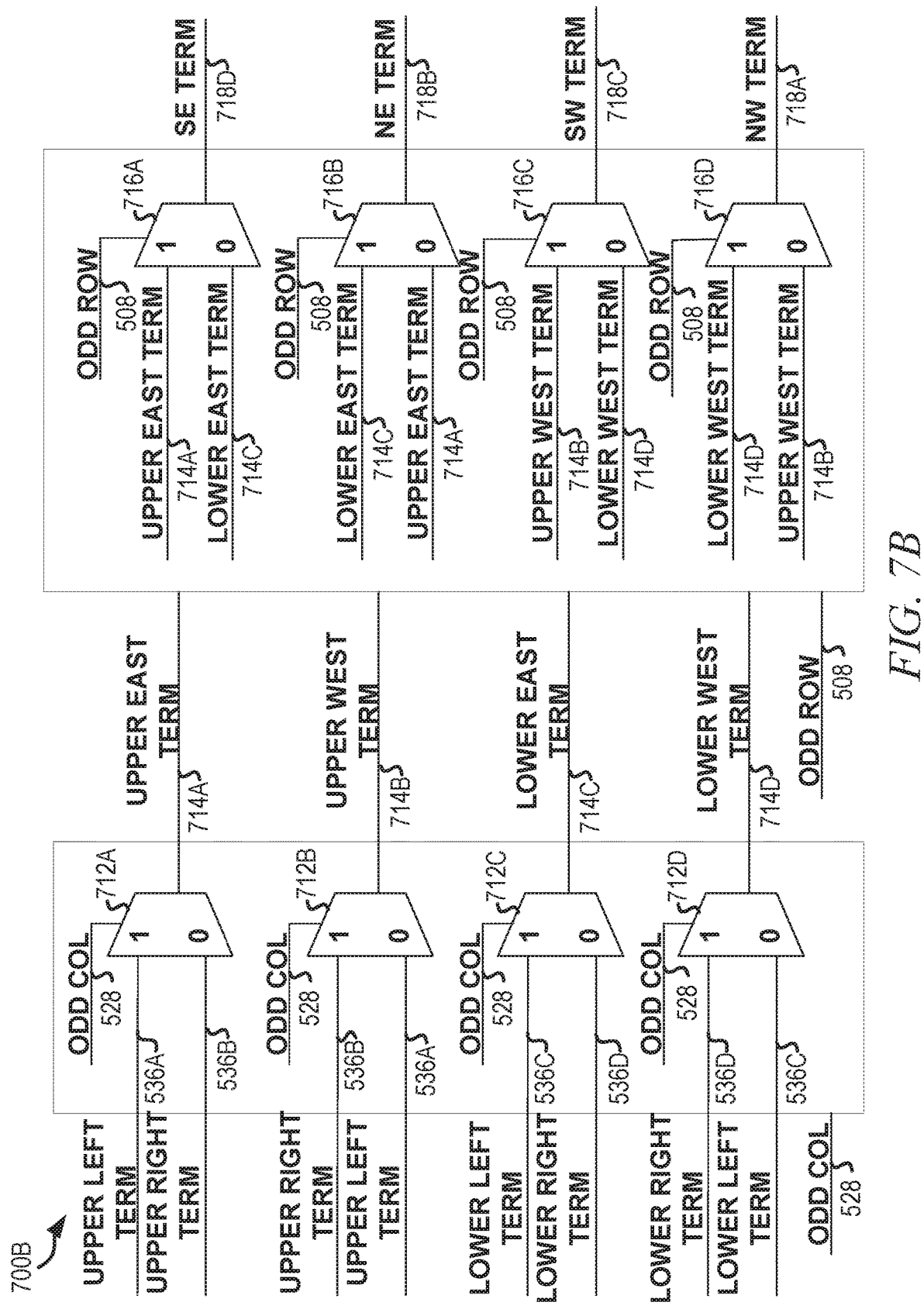
FIG. 7B illustrates, by way of example, a diagram of an embodiment of circuitry to alter positions of fractional terms.

FIG. 7B illustrates, by way of example, a diagram of an embodiment of circuitry 700B to alter positions of fraction portion terms. The circuitry 700B can orient the terms 536A-536D so that they are applied to the read data 606A-606D properly. The circuitry 700B can handle the swapping of the terms so that the terms 536A-536D are applied properly to the proper terms.

The circuitry 700B as illustrated includes a first level of multiplexers 712A, 712B, 712C, and 712D and a second level of multiplexers 716A, 716B, 716C, and 716D. The multiplexers 712A-712D swap read data in a column direction (e.g., left/right as shown in FIG. 2). The multiplexers 716A-716D swap read data in a row direction (e.g., up/down as shown in FIG. 2).

The inputs to the multiplexers 712A-712D include terms from the fraction portion circuitry 534. As illustrated, the inputs include the terms 536A-536D from FIG. 5. The inputs to the multiplexers 712A-712D further include the odd column 528 from FIG. 5.

The multiplexer 712A outputs an upper east term 714A (upper right in terms of which vertex of the box 212A-212D the term operates on). If odd column 528 is one, the upper east term 714A is the upper left term 536A. If odd column 528 is zero, the upper east term 714A is the upper right term 536B. The multiplexer 712B outputs upper west term 714B (upper left in terms of which vertex of the box 212A-212D the term operates on). If odd column 528 is one, the upper west term 714B is the upper right term 536B. If odd column 528 is zero, the upper west term 714B is the upper left term 714B.

The multiplexer 712C outputs lower east term 714C (lower right in terms of which vertex of the box 212A-212D the term operates on). If odd column 528 is one, the lower east term 714C is the lower left term 536C. If odd column 528 is zero, the lower east term 714C is the lower right term 536D. The multiplexer 712D outputs lower west term 714D (lower left in terms of which vertex of the box 212A-212D the term operates on). If odd column 528 is one, the lower west term 714D is the lower right term 536D. If odd column 528 is zero, the lower west term 714D is the lower left term 536C.

The inputs to the multiplexers 716A-716D include the outputs from the multiplexers 712A-712D (e.g., the upper east term 714A, the upper west term 714B, the lower east term 714C, and the lower west term 714D). The inputs to the multiplexers 716A-716D further include the odd row 508 from FIG. 5.

The multiplexer 716A outputs a southeast term 718D (lower right in terms of which vertex of the box 212A-212D the term operates on). If odd row 508 is one, the southeast term 718D is the upper east term 714A. If odd row 508 is zero, the southeast term 718D is the lower east term 714C. The multiplexer 716B outputs northeast term 718B (upper right in terms of which vertex of the box 212A-212D the term operates on). If odd row 508 is one, the northeast 718B is the lower east term 714C. If odd row 508 is zero, the northeast term 718B is the upper east term 714A.

The multiplexer 716C outputs southwest term 718C (lower left in terms of which vertex of the box 212A-212D the term operates on). If odd row 508 is one, the southwest term 718C is the upper west term 714B. If odd row 508 is zero, the southwest term 718C is the lower west term 714D. The multiplexer 716D outputs northwest term 718A (upper left in terms of which vertex of the box 212A-212D the term operates on). If odd row 508 is one, the northwest term 718A is the lower west term 714D. If odd row 508 is zero, the northwest term 718A is the upper west term 714B.

Figure 8A:
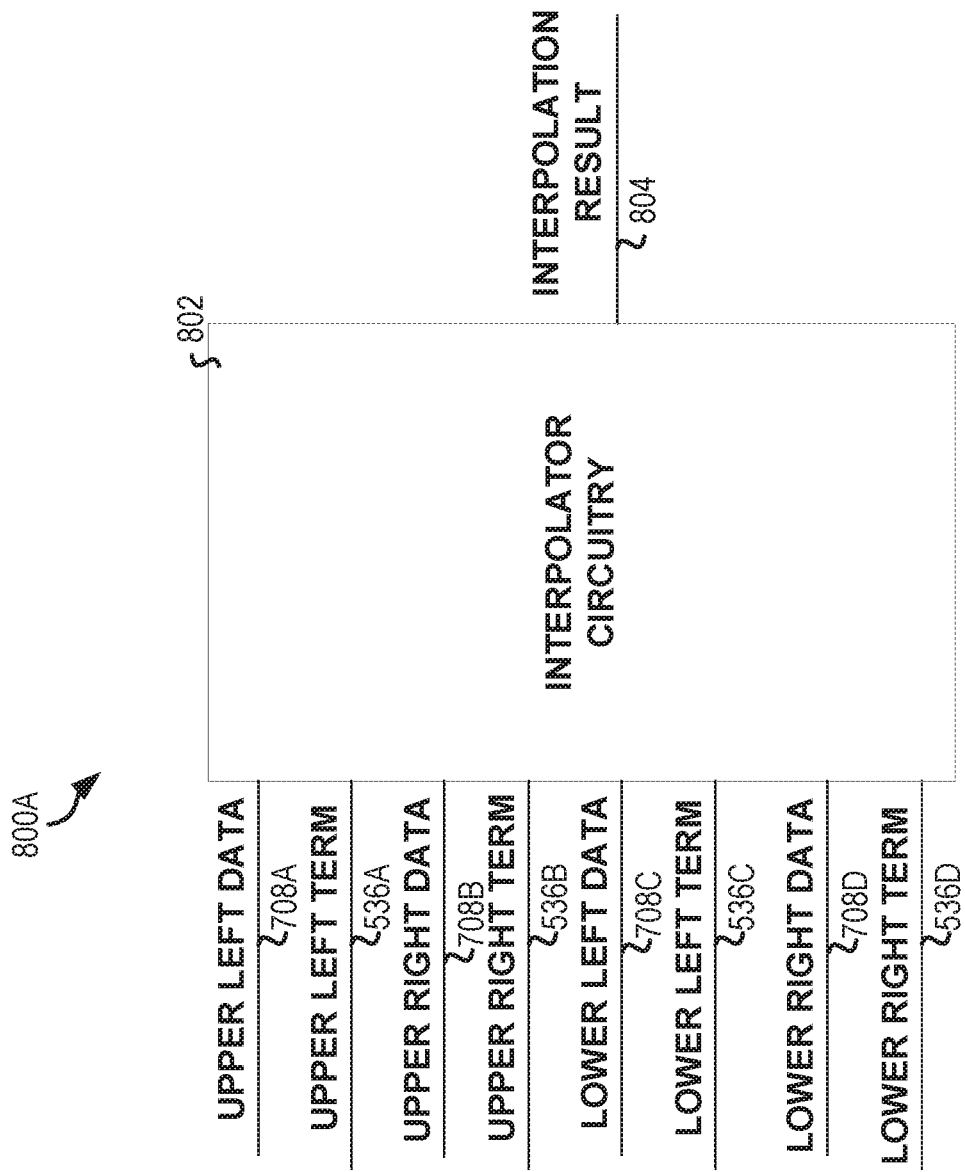
FIG. 8A illustrates, by way of example, a diagram of a system for performing interpolation on data from the memory portions when the data positions have been altered.

FIG. 8A illustrates, by way of example, a diagram of a system 800A for performing interpolation on data from the memory portions 302A-302D. Each of the data 708A-708D from the circuitry 700A and the terms 536A-536D are input into interpolator circuitry 802. The interpolator circuitry 802 produces an interpolation result 804 based on the input data 708A-708D, and the terms 536A-536D. There are a variety of ways of performing an interpolation and the interpolation circuitry 802 can be configured to perform any of the interpolation methods.

Figure 8B:
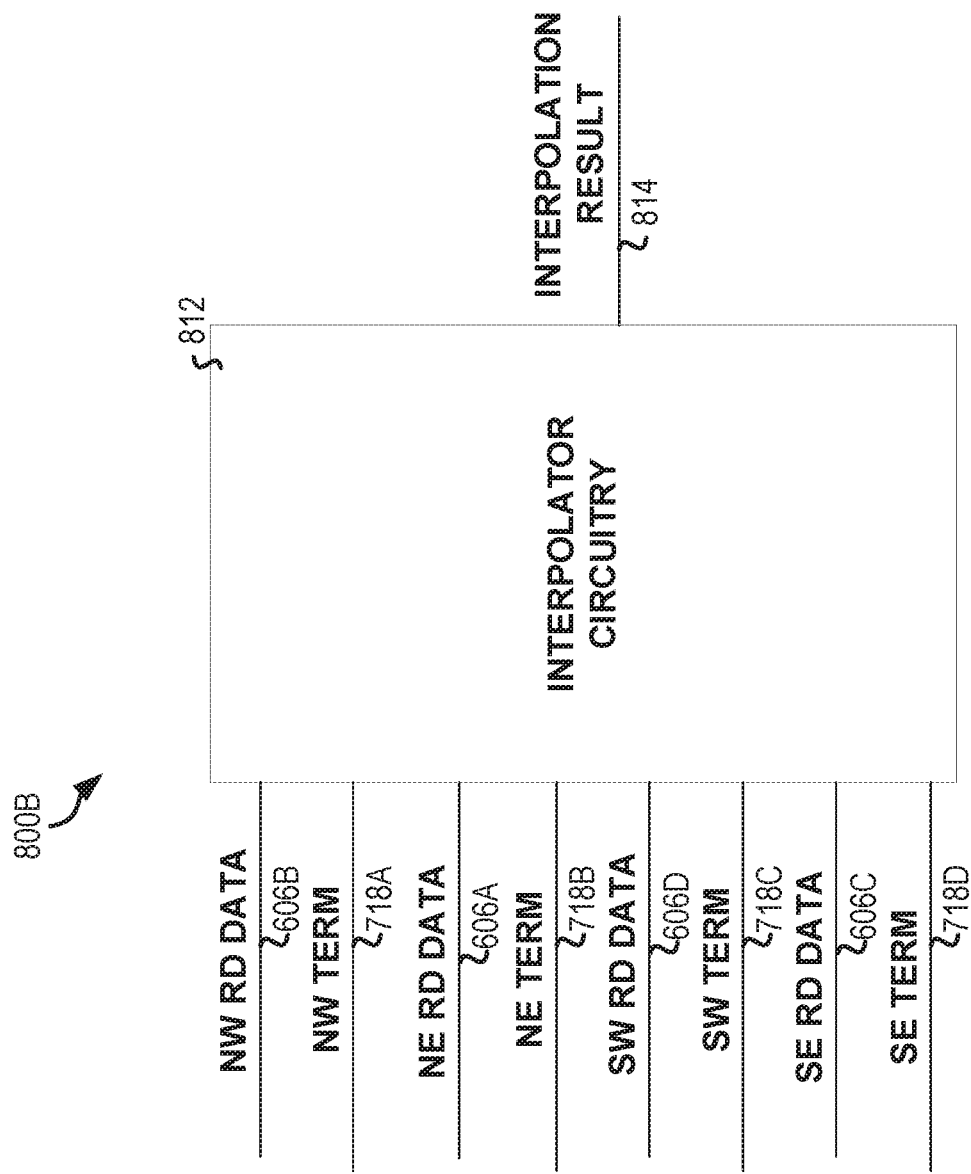
FIG. 8B illustrates, by way of example, a diagram of a system for performing interpolation on data from the memory portions when the term positions have been altered.

FIG. 8B illustrates, by way of example, a diagram of another system 800B for performing interpolation on data from the memory portions 302A-302D. Each of the terms 718A-718D from the circuitry 700B and the data 606A-606D from FIG. 6 are input into interpolator circuitry 812. The interpolator circuitry 812 produces an interpolation result 814 based on the terms 718A-718D and the data 606A-606D. There are a variety of ways of performing an interpolation and the interpolation circuitry 812 can be configured to perform any of the interpolation methods.

There are a variety of methods of performing interpolation. The circuitry 802 and/or 812, along with the terms generated by circuitry 534 can be configured to perform any of the methods of interpolation. The circuitry 534, 802 and/or 812 can include one or more electrical and/or electric components, such as one or more resistors, capacitors, transistors, inductors, multiplexers, diodes, buffers, amplifiers, encoders/decoders, regulators, analog-to-digital converters, digital-to-analog converters, rectifiers, oscillators, logic gates (e.g., AND, OR, NAND, or NOR gates), inverters, multipliers, dividers, adders, subtracters, the like.

Figure 9:
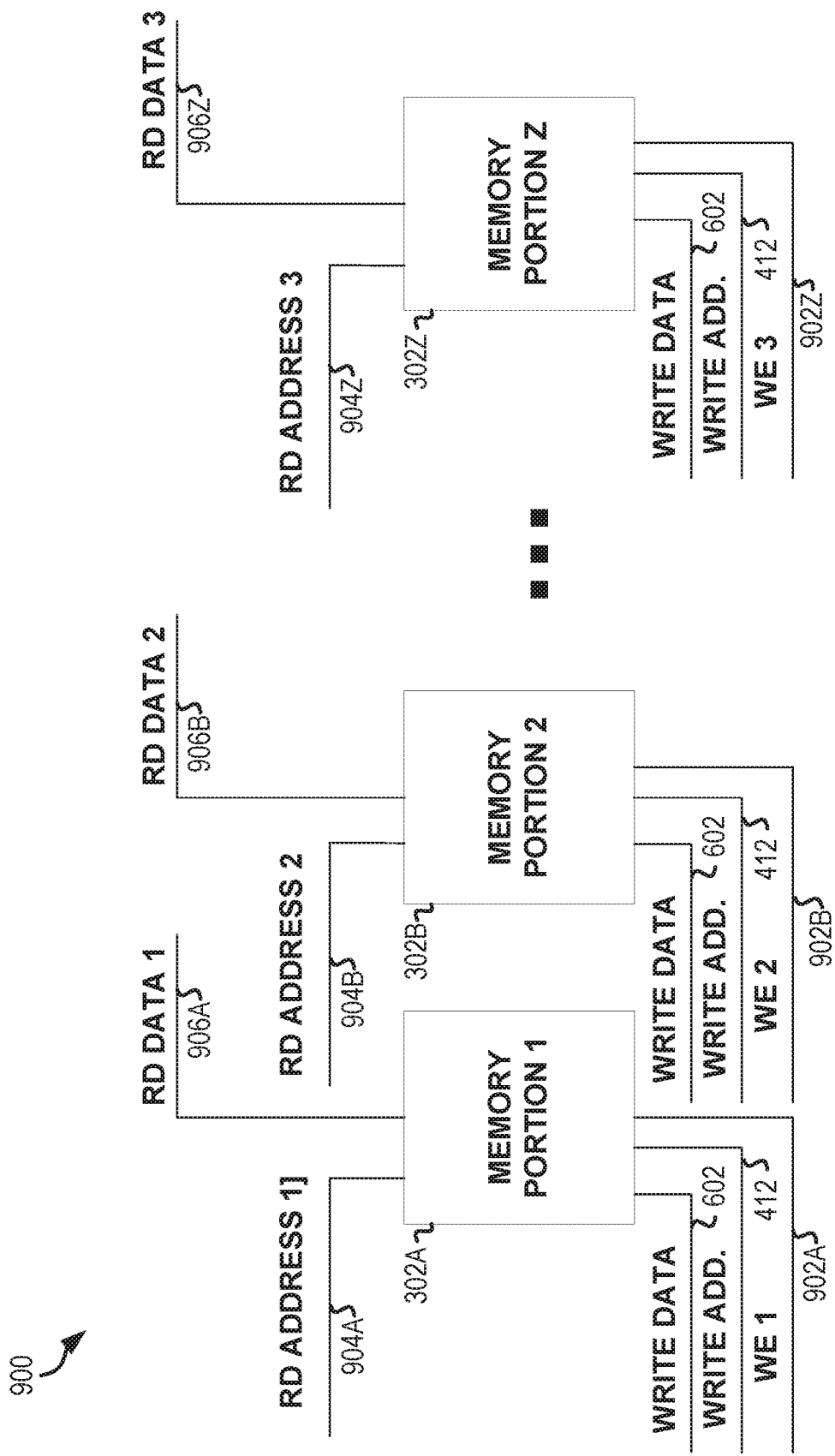
FIG. 9 illustrates, by way of example, a diagram of another system of memory portions.

FIG. 9 illustrates, by way of example, a diagram of another embodiment of memory portions 900. The discussion thus far has focused on interpolation that is performed using only four terms. Some interpolation techniques use more than four terms in determining an interpolation result. In such embodiments, the systems, circuitry, methods, or the like of the FIGS. can be adjusted to apply to such systems. For example, the data set 200 can be split into more than four disjoint subsets of data and stored in a number of memory portions equal to the number of disjoint subsets. In another example, the system for such interpolation that is used to determine which memory portion to load can include a number of logic gates equal to the number of memory portions. The address read circuitry of FIG. 5 and the swapping circuitry of FIGS. 7A-7B can likewise be extended to accommodate the increased number of memory portions.

FIG. 9 illustrates how the number of memory portions can be extended to a number greater than four. The system 900 of FIG. 9 includes the memory portions 302A-302Z. The inputs to the memory portions 302A-302Z include inputs and outputs similar to, or the same as, the system 600 with the memory portions 302A-302Z including a different write enable 902A, 902B, and 902Z, respectively, read addresses 902A, 902B, and 902Z, respectively, and read data 902A, 902B, and 902Z, respectively.

Figure 10:
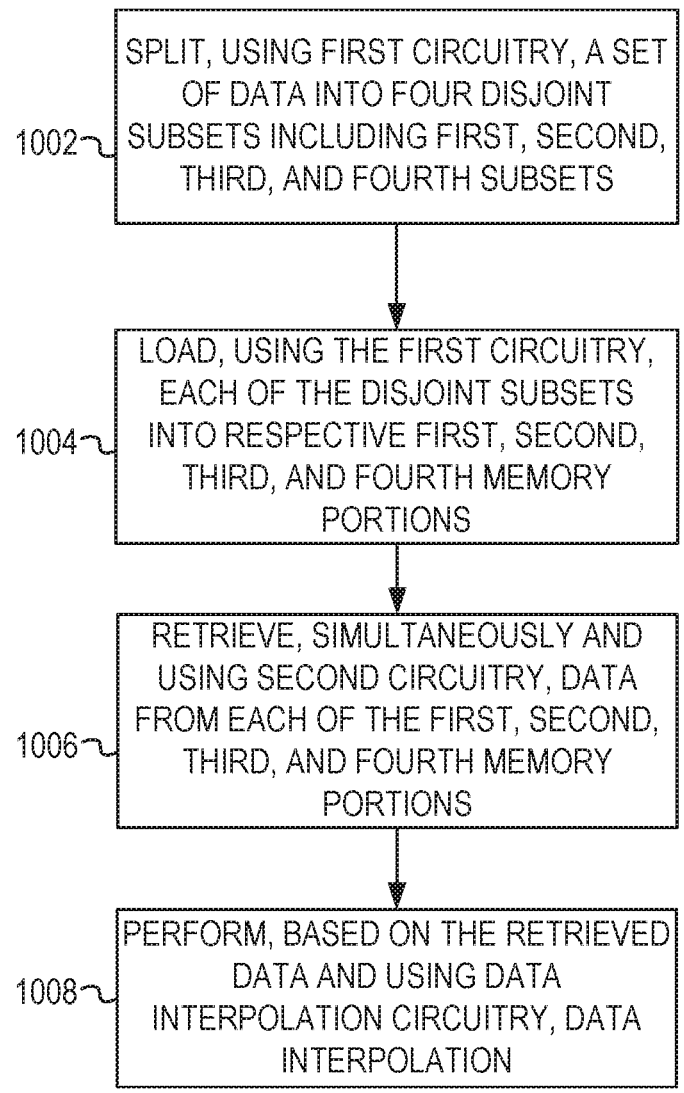
FIG. 10 illustrates, by way of example, a flow diagram of an embodiment of a method for interpolation of data.

FIG. 10 illustrates, by way of example, a flow diagram of an embodiment of a method 1000 for interpolation of data. At operation 1002, using first circuitry (e.g., circuitry from FIG. 4 or equivalent), a set of data is split into four disjoint subsets including first, second, third, and fourth subsets. At operation 1004, using the first circuitry, each of the disjoint subsets is loaded into respective first, second, third, and fourth memory portions. At operation 1006, using second circuitry (e.g., circuitry from FIG. 6), data is retrieved from each of the first, second, third, and fourth memory portions (e.g., memory portions from FIG. 6), simultaneously. At operation 1008, using interpolation circuitry (e.g., from FIGS. 8A and/or 8B), data interpolation is performed.

The method 1000 may further include, wherein the first disjoint subset of data includes data from the set of data in an even column and an even row, the second disjoint subset of data includes data from the set of data in an even column and an odd row, the third disjoint subset of data includes data from the set of data in an odd column and an even row, and the fourth disjoint subset of data includes data from the set of data in an odd column and an odd row. The method 1000 may further include, wherein an address of the data in each of the disjoint subsets of data includes a row of the data in the set of data minus the least significant bit of the row, and a column of the data in the set of data minus the least significant bit of the column. The first circuitry may include first, second, third, and fourth logic gates coupled to each of the first, second, third, and fourth memory portions, respectively. In one or more embodiments, each of the logic gates include the least significant of the column, the least significant bit of the row, and a write enable bit as an input. In one or more embodiments, the first, second, third, and fourth logic gates are first, second, third, and fourth AND gates, the second AND gate includes a first inverter coupled to the input coupled to the least significant bit of the row, the third AND gate includes a second inverter coupled to the input coupled to the least significant bit of the column, and the fourth AND gate includes a third inverter coupled to the input coupled to the least significant bit of the column and a fourth inverter coupled to the input coupled to the least significant bit of the row.

In one or more embodiments, the second circuitry includes a first adder with the least significant bit of the row and the address as inputs and a second adder with the least significant of the column and the address as input. The method 1000 may further include swapping, using third circuitry, data retrieved from the memory portions to change their positions relative to one another for the data interpolation. In one or more embodiments, the third circuitry includes a first level of multiplexers to swap relative rows of the of the retrieved data and a second level of multiplexers to swap relative columns of the retrieved data.

Figure 11:
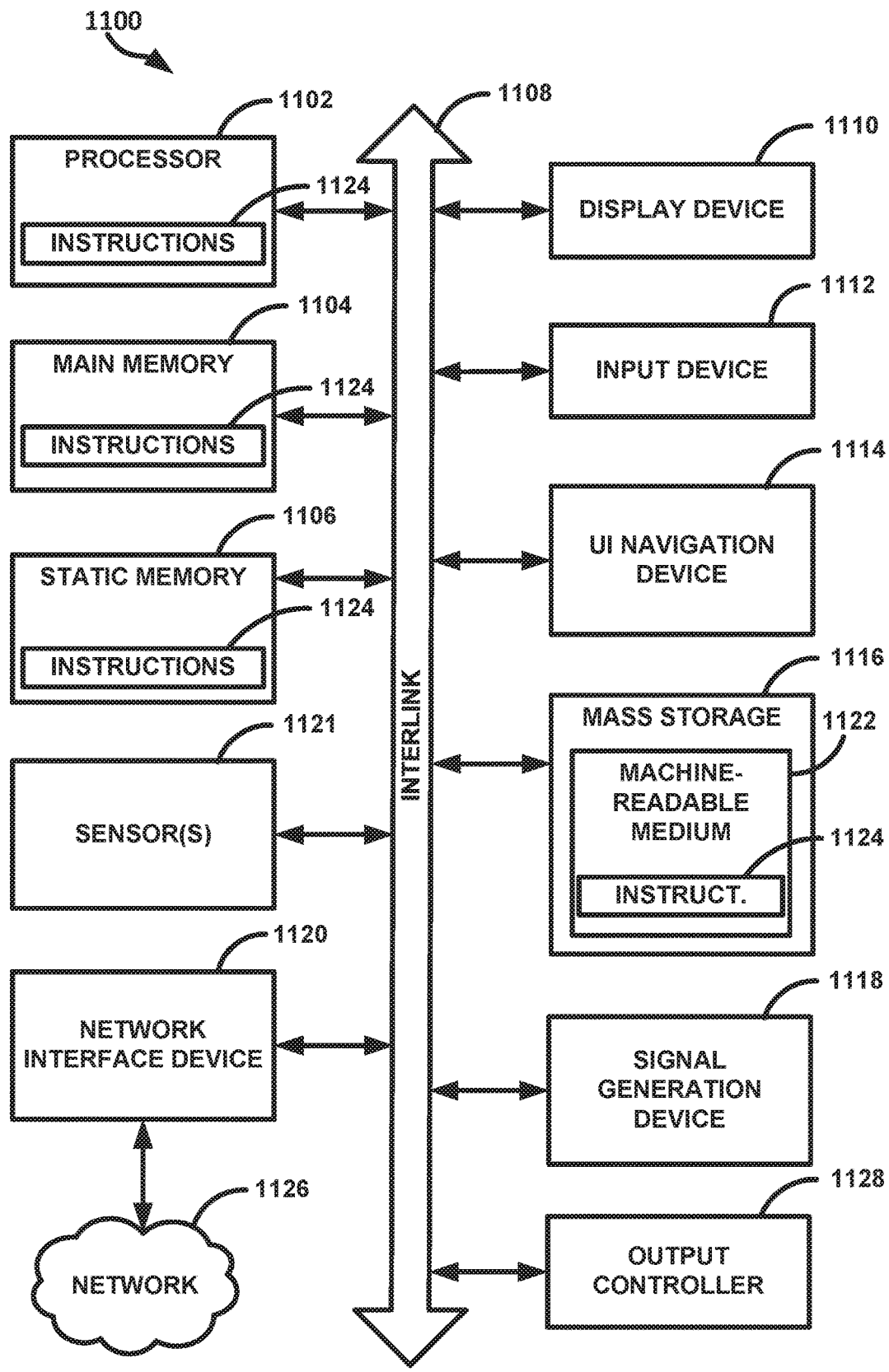
FIG. 11 illustrates, by way of example, a block diagram of an embodiment of a machine on which one or more of the methods as discussed herein can be implemented.

FIG. 11 illustrates, by way of example, a block diagram of an embodiment of a machine 1100 on which one or more of the methods as discussed herein can be implemented. In one or more embodiments, one or more items of the interpolator circuitry 802, fraction portion circuitry 534, circuitry 700A, circuitry 700B, system 500, and system 400 may be implemented by the machine 1100. In alternative embodiments, the machine 1100 operates as a standalone device or may be connected (e.g., networked) to other machines. In one or more embodiments, one or more of the interpolator circuitry 802, fraction portion circuitry 534, circuitry 700A, circuitry 700B, system 500, and system 400 may be implemented by the machine 1100 can include one or more of the items of the machine 1100. In a networked deployment, the machine 1100 may operate in the capacity of a server or a client machine in server-client network environment, or as a peer machine in a peer-to-peer (or distributed) network environment. The machine 1100 may be a personal computer (PC), a tablet PC, a set-top box (STB), a Personal Digital Assistant (PDA), a cellular telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example machine 1100 includes processing circuitry 1102 (e.g., a central processing unit (CPU), a graphics processing unit (GPU), an application specific integrated circuit, circuitry, such as one or more transistors, resistors, capacitors, inductors, diodes, logic gates, multiplexers, buffers, modulators, demodulators, radios (e.g., transmit or receive radios or transceivers), sensors 1121 (e.g., a transducer that converts one form of energy (e.g., light, heat, electrical, mechanical, or other energy) to another form of energy), or the like, or a combination thereof), a main memory 1104 and a static memory 1106, which communicate with each other via a bus 1108. The machine 1100 (e.g., computer system) may further include a video display unit 1110 (e.g., a liquid crystal display (LCD) or a cathode ray tube (CRT)). The machine 1100 also includes an alphanumeric input device 1112 (e.g., a keyboard), a user interface (UI) navigation device 1114 (e.g., a mouse), a disk drive or mass storage unit 1116, a signal generation device 1118 (e.g., a speaker) and a network interface device 1120.

The disk drive unit 1116 includes a machine-readable medium 1122 on which is stored one or more sets of instructions and data structures (e.g., software) 1124 embodying or utilized by any one or more of the methodologies or functions described herein. The instructions 1124 may also reside, completely or at least partially, within the main memory 1104 and/or within the processor 1102 during execution thereof by the machine 1100, the main memory 1104 and the processor 1102 also constituting machine-readable media.

The machine 1100 as illustrated includes an output controller 1128. The output controller 1128 manages data flow to/from the machine 1100. The output controller 1128 is sometimes called a device controller, with software that directly interacts with the output controller 1128 being called a device driver.

While the machine-readable medium 1122 is shown in an example embodiment to be a single medium, the term "machine-readable medium" may include a single medium or multiple media (e.g., a centralized or distributed database, and/or associated caches and servers) that store the one or more instructions or data structures. The term "machine-readable medium" shall also be taken to include any tangible medium that is capable of storing, encoding or carrying instructions for execution by the machine and that cause the machine to perform any one or more of the methodologies of the present invention, or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including by way of example semiconductor memory devices, e.g., Erasable Programmable Read-Only Memory (EPROM), Electrically Erasable Programmable Read-Only Memory (EEPROM), and flash memory devices; magnetic disks such as internal hard disks and removable disks; magneto-optical disks; and CD-ROM and DVD-ROM disks.

The instructions 1124 may further be transmitted or received over a communications network 1126 using a transmission medium. The instructions 1124 may be transmitted using the network interface device 1120 and any one of several well-known transfer protocols (e.g., HTTP). Examples of communication networks include a local area network ("LAN"), a wide area network ("WAN"), the Internet, mobile telephone networks, Plain Old Telephone (POTS) networks, and wireless data networks (e.g., WiFi and WiMax networks). The term "transmission medium" shall be taken to include any intangible medium that is capable of storing, encoding or carrying instructions for execution by the machine, and includes digital or analog communications signals or other intangible media to facilitate communication of such software.

Embodiments and Additional Notes

Embodiment 1 includes a system for data interpolation comprising first circuitry to split a set of data into four disjoint subsets including first, second, third, and fourth subsets and load each of the disjoints subsets into respective first, second, third, and fourth memory portions, second circuitry to retrieve, simultaneously, data from each of the first, second, third, and fourth memory portions, and interpolation circuitry to perform, based on the retrieved data, data interpolation.

In Embodiment 2, the subject matter of Embodiment 1 optionally includes wherein the first circuitry to split the set of data into subsets includes the first disjoint subset of data includes data from the set of data in an even column and an even row, the second disjoint subset of data includes data from the set of data in an even column and an odd row, the third disjoint subset of data includes data from the set of data in an odd column and an even row, and the fourth disjoint subset of data includes data from the set of data in an odd column and an odd row.

In Embodiment 3, the subject matter of at least one of Embodiments 1-2 optionally includes, wherein the first circuitry is to load the data in each of the disjoint subsets to an address that includes a row of the data in the set of data minus the least significant bit of the row, and a column of the data in the set of data minus the least significant bit of the column.

In Embodiment 4, the subject matter of at least one of Embodiments 1-3 optionally includes, wherein the first circuitry includes first, second, third, and fourth logic gates coupled to each of the first, second, third, and fourth memory portions, respectively.

In Embodiment 5, the subject matter of Embodiment 4 optionally includes, wherein each of the logic gates include the least significant bit of the column, the least significant bit of the row, and a write enable bit as inputs.

In Embodiment 6, the subject matter of at least one of Embodiments 4-5 optionally includes, wherein the first, second, third, and fourth logic gates are first, second, third, and fourth AND gates, and the second AND gate includes a first inverter coupled to the input coupled to the least significant bit of the row, the third AND gate includes a second inverter coupled to the input coupled to the least significant bit of the column, and the fourth AND gate includes a third inverter coupled to the input coupled to the least significant bit of the column and a fourth inverter coupled to the input coupled to the least significant bit of the row.

In Embodiment 7, the subject matter of at least one of Embodiments 3-6 optionally includes, wherein the second circuitry includes a first adder with the least significant bit of the row and the address as inputs and a second adder with the least significant bit of the column and the address as inputs.

In Embodiment 8, the subject matter of at least one of Embodiments 1-7 optionally includes third circuitry to swap data retrieved from the memory portions to change their position relative to each other in the data interpolation.

In Embodiment 9, the subject matter of Embodiment 8 optionally includes, wherein the third circuitry includes a first level of multiplexers to swap relative rows of the retrieved data and a second level of multiplexers to swap relative columns of the retrieved data.

Embodiment 10 includes a method for data interpolation comprising splitting, using first circuitry, a set of data into four disjoint subsets including first, second, third, and fourth subsets, loading, using the first circuitry, each of the disjoints subsets of data into respective first, second, third, and fourth memory portions, retrieving, simultaneously and using second circuitry, data from each of the first, second, third, and fourth memory portions, and performing, based on the retrieved data and using data interpolation circuitry, data interpolation.

In Embodiment 11, the subject matter of Embodiment 10 optionally includes, wherein the first disjoint subset of data includes data from the set of data in an even column and an even row, the second disjoint subset of data includes data from the set of data in an even column and an odd row, the third disjoint subset of data includes data from the set of data in an odd column and an even row, and the fourth disjoint subset of data includes data from the set of data in an odd column and an odd row.

In Embodiment 12, the subject matter of Embodiment 11 optionally includes, wherein an address of the data in each of the disjoint subsets of data includes a row of the data in the set of data minus the least significant bit of the row, and a column of the data in the set of data minus the least significant bit of the column.

In Embodiment 13, the subject matter of Embodiment 12 optionally includes, wherein the first circuitry includes first, second, third, and fourth logic gates coupled to each of the first, second, third, and fourth memory portions, respectively.

In Embodiment 14, the subject matter of Embodiment 13 optionally includes, wherein each of the logic gates include the least significant of the column, the least significant bit of the row, and a write enable bit as an input.

In Embodiment 15, the subject matter of Embodiment 14 optionally includes, wherein the first, second, third, and fourth logic gates are first, second, third, and fourth AND gates, the second AND gate includes a first inverter coupled to the input coupled to the least significant bit of the row, the third AND gate includes a second inverter coupled to the input coupled to the least significant bit of the column, and the fourth AND gate includes a third inverter coupled to the input coupled to the least significant bit of the column and a fourth inverter coupled to the input coupled to the least significant bit of the row.

In Embodiment 16, the subject matter of at least one of Embodiments 12-15 optionally includes, wherein the second circuitry includes a first adder with the least significant bit of the row and the address as inputs and a second adder with the least significant of the column and the address as input.

In Embodiment 17, the subject matter of at least one of Embodiments 10-16 optionally includes swapping, using third circuitry, data retrieved from the memory portions to change their positions relative to one another for the data interpolation.

In Embodiment 18, the subject matter of Embodiment 17 optionally includes, wherein the third circuitry includes a first level of multiplexers to swap relative rows of the of the retrieved data and a second level of multiplexers to swap relative columns of the retrieved data.

Embodiment 19 includes at least one machine-readable medium the machine-readable medium including instructions, which when performed by a machine, cause the machine to performs operations for data interpolation, the operations comprising splitting a set of data into four disjoint subsets including first, second, third, and fourth subsets, loading each of the disjoints subsets of data into respective first, second, third, and fourth memory portions, retrieving, simultaneously, data from each of the first, second, third, and fourth memory portions, and performing, based on the retrieved data, data interpolation.

In Embodiment 20, the subject matter of Embodiment 19 optionally includes, wherein the first disjoint subset of data includes data from the set of data in an even column and an even row, the second disjoint subset of data includes data from the set of data in an even column and an odd row, the third disjoint subset of data includes data from the set of data in an odd column and an even row, and the fourth disjoint subset of data includes data from the set of data in an odd column and an odd row.

In Embodiment 21, the subject matter of Embodiment 21 optionally includes, wherein an address of the data in each of the disjoint subsets of data includes a row of the data in the set of data minus the least significant bit of the row, and a column of the data in the set of data minus the least significant bit of the column.

In Embodiment 22, the subject matter of at least one of Embodiments 19-21 optionally includes, wherein the operations further include swapping fractional interpolation terms to change their positions relative to one another for the data interpolation.

Although an embodiment has been described with reference to specific embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

What is claimed is:
1. A system for data interpolation comprising:
a memory including first, second, third, and fourth memory portions;
first circuitry to split data into four disjoint subsets including first, second, third, and fourth disjoint subsets and load each of the disjoint subsets into the first, second, third, and fourth memory portions, respectively, the data distributed in regular intervals about a grid, the grid including rows and columns representing the data value in a first dimension and a second dimension, respectively, the data increasing or decreasing in value as a row number of the rows increases and as a column number of the columns increase, the first disjoint subset including data in an even column of the columns and an even row of the rows, the second disjoint subset including data in an even column of the columns and an odd row of the rows, the third disjoint subset including data in an odd column of the columns and an even row of the rows, and the fourth disjoint subset including data in an odd column of the columns and an odd row of the rows;
second circuitry to retrieve, simultaneously, data from each of the first, second, third, and fourth memory portions; and
interpolation circuitry to perform, based on the retrieved data, data interpolation.

2. The system of claim 1, wherein the first circuitry is to load the data in each of the disjoint subsets to an address of the respective memory portion that includes a row of the data in the grid of data minus the least significant bit of the row, and a column of the data in the grid of data minus the least significant bit of the column.

3. The system of claim 2, wherein the second circuitry includes a first adder with the least significant bit of the row and the address as inputs and a second adder with the least significant bit of the column and the address as inputs.

4. The system of claim 2, wherein the first circuitry includes first, second, third, and fourth logic gates coupled to each of the first, second, third, and fourth memory portions, respectively.

5. The system of claim 4, wherein each of the logic gates include the least significant bit of the column, the least significant bit of the row, and a write enable bit as inputs.

6. The system of claim 5, wherein the first, second, third, and fourth logic gates are first, second, third, and fourth AND gates and:
the second AND gate includes a first inverter coupled to the input coupled to the least significant bit of the row,
the third AND gate includes a second inverter coupled to the input coupled to the least significant bit of the column, and
the fourth AND gate includes a third inverter coupled to the input coupled to the least significant bit of the column and a fourth inverter coupled to the input coupled to the least significant bit of the row.

7. The system of claim 1, further comprising:
third circuitry to swap data retrieved from the memory portions to change their position relative to each other in the data interpolation.

8. The system of claim 7, wherein the third circuitry includes a first level of multiplexers to swap relative rows of the retrieved data and a second level of multiplexers to swap relative columns of the retrieved data.

9. A method for data interpolation comprising:
splitting, using first circuitry, data into four disjoint subsets including first, second, third, and fourth disjoint subsets, the data distributed in regular intervals about a grid, the grid including rows and columns representing the data value in a first dimension and a second dimension, respectively, the data increasing or decreasing in value as a row number of the rows and as a column number of the columns increases, the first disjoint subset including data in an even column of the columns and an even row of the rows, the second disjoint subset including data in an even column of the columns and an odd row of the rows, the third disjoint subset including data in an odd column of the columns and an even row of the rows, and the fourth disjoint subset including data in an odd column of the columns and an odd row of the rows;
loading, using the first circuitry, each of the disjoint subsets into respective first, second, third, and fourth memory portions;
retrieving, simultaneously and using second circuitry, data from each of the first, second, third, and fourth memory portions; and
performing, based on the retrieved data and using data interpolation circuitry, data interpolation.

10. The method of claim 9, wherein an address of the data in each of the disjoint subsets in the respective memory portion includes a row of the data in the grid of data minus the least significant bit of the row, and a column of the data in the grid of data minus the least significant bit of the column.

11. The method of claim 10, wherein the second circuitry includes a first adder with the least significant bit of the row and the address as inputs and a second adder with the least significant of the column and the address as input.

12. The method of claim 10, wherein the first circuitry includes first, second, third, and fourth logic gates coupled to each of the first, second, third, and fourth memory portions, respectively.

13. The method of claim 12, wherein each of the logic gates include the least significant of the column, the least significant bit of the row, and a write enable bit as an input.

14. The method of claim 13, wherein the first, second, third, and fourth logic gates are first, second, third, and fourth AND gates:
the second AND gate includes a first inverter coupled to the input coupled to the least significant bit of the row,
the third AND gate includes a second inverter coupled to the input coupled to the least significant bit of the column, and
the fourth AND gate includes a third inverter coupled to the input coupled to the least significant bit of the column and a fourth inverter coupled to the input coupled to the least significant bit of the row.

15. At least one machine-readable medium the machine-readable medium including instructions, which when performed by a machine, cause the machine to performs operations for data interpolation, the operations comprising:
splitting data into four disjoint subsets including first, second, third, and fourth disjoint subsets, the data distributed in regular intervals about a grid, the grid including rows and columns representing the data value in a first dimension and a second dimension, respectively, the data increasing or decreasing in value as a row number of the rows and as a column number of the columns increases, the first disjoint subset including data in an even column of the columns and an even row of the rows, the second disjoint subset including data in an even column of the columns and an odd row of the rows, the third disjoint subset including data in an odd column of the columns and an even row of the rows, and the fourth disjoint subset including data in an odd column of the columns and an odd row of the rows;
loading each of the disjoints subsets of data into respective first, second, third, and fourth memory portions;
retrieving, simultaneously, data from each of the first, second, third, and fourth memory portions; and
performing, based on the retrieved data, data interpolation.

16. The non-transitory machine-readable medium of claim 15, wherein an address of the data in each of the disjoint subsets of data of the respective memory portion includes a row of the data in the grid of data minus the least significant bit of the row, and a column of the data in the grid of data minus the least significant bit of the column.

17. The non-transitory machine-readable medium of claim 15, further comprising swapping fractional interpolation terms to change their positions relative to one another for the data interpolation.

* * * * *